United States Patent
Naya et al.

(10) Patent No.: US 7,732,745 B2
(45) Date of Patent: Jun. 8, 2010

(54) IMAGING APPARATUS INCLUDING A SOLID STATE IMAGING DEVICE INCLUDING A PLURALITY OF PHOTO DIODES

(75) Inventors: Masayuki Naya, Kanagawa (JP); Jingbo Li, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 106 days.

(21) Appl. No.: 12/073,547

(22) Filed: Mar. 6, 2008

(65) Prior Publication Data

US 2008/0217513 A1 Sep. 11, 2008

(30) Foreign Application Priority Data

Mar. 7, 2007 (JP) .............................. 2007-056612

(51) Int. Cl.
*H01L 27/00* (2006.01)

(52) U.S. Cl. ................................... 250/208.1; 348/335

(58) Field of Classification Search ............... 250/208.1, 250/216, 214.1; 348/335
See application file for complete search history.

(56) References Cited

U.S. PATENT DOCUMENTS 7,119,319 B2 * 10/2006 Noto et al. ............... 250/208.1

FOREIGN PATENT DOCUMENTS

JP 2005-142429 6/2005

OTHER PUBLICATIONS

RCA, Electro-Optics-Handbook, 1974, p. 159.*

* cited by examiner

*Primary Examiner*—Georgia Y Epps
*Assistant Examiner*—Tony Ko
(74) *Attorney, Agent, or Firm*—McGinn IP Law Group, PLLC

(57) ABSTRACT

An imaging apparatus includes a solid state imaging device having a light receiving characteristic in which an amount of light received reaches a maximum when an angle of incidence of parallel light, radiated at continuously changing angle, is not vertical (angle θ of incident light in the range of 3° to 15°) to a light receiving surface. This characteristic changes the amount of light received greatly when an aperture stop is opened, and enhances an opening/closing effect of the aperture stop. The solid state imaging device includes a core/clad light guide path structure, whose core serves as a light guide path. This light guide path includes a columnar portion located above a photodiode, and a lens portion on the columnar portion.

20 Claims, 9 Drawing Sheets

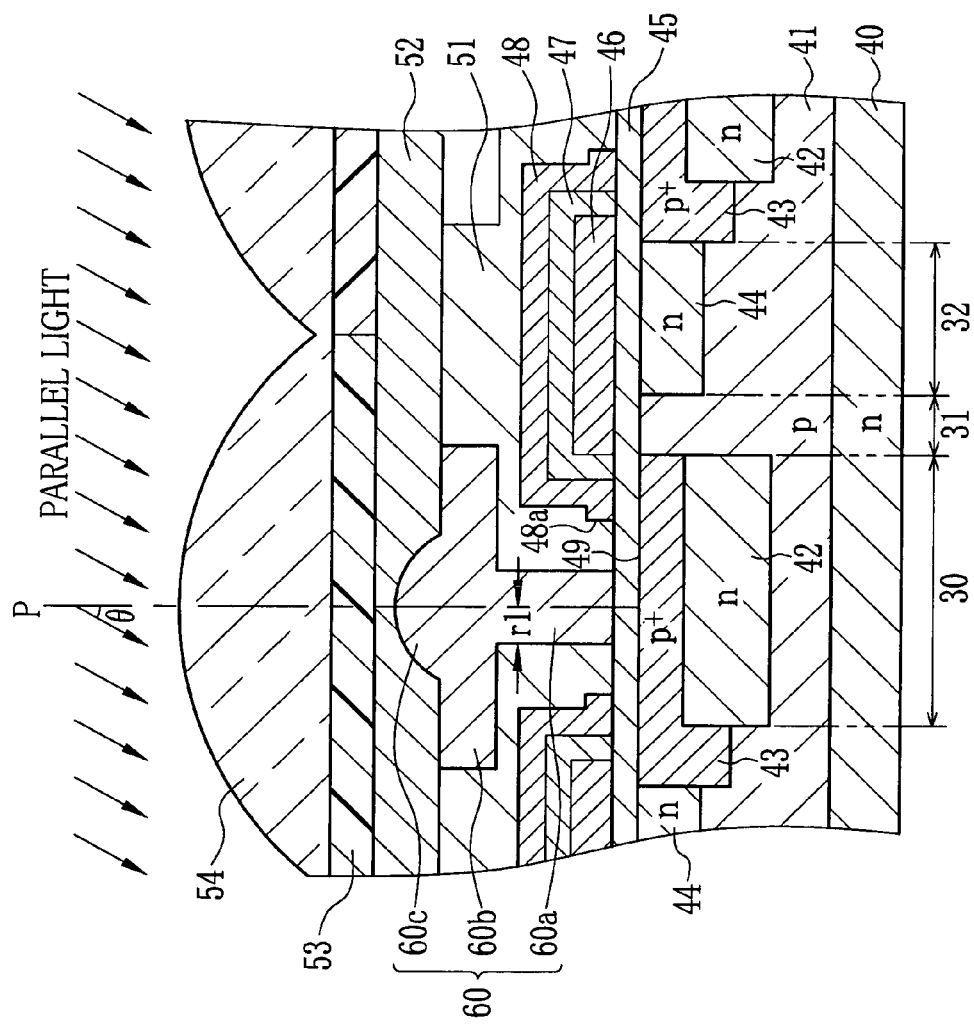

US 7,732,745 B2

IMAGING APPARATUS INCLUDING A SOLID STATE IMAGING DEVICE INCLUDING A PLURALITY OF PHOTO DIODES

FIELD OF THE INVENTION

The present invention relates to an imaging apparatus having a solid state imaging device such as a CCD.

BACKGROUND OF THE INVENTION

Digital cameras are becoming very popular these days. Equipped with a solid state imaging device, such as a CCD (charge coupled device) image sensor or a CMOS (complementary metal oxide semiconductor) image sensor, the digital camera converts a subject image formed on a light receiving surface of the image sensor into digital image data, and then stores this data. Similar to the film cameras, some of the digital cameras have an aperture stop to limit the amount of incident light.

The CCD image sensor, for example, has a light shielding film on a silicon substrate, and this light shielding film has a matrix of openings. Formed inside of each opening is a photodiode that converts incident light into an electric charge and stores it. To increase the amount of light incident on the photodiodes, there are provided an inner-layer lens and a micro-lens on the photodiode in each opening. However, as shown in FIG. 10, the photodiodes have a light-receiving characteristic in which an amount of light received reaches a maximum when an angle of incidence is 0° (when the light vertically strikes the light receiving surface), and as the angle of incidence becomes wider, the amount of light received decreases (see, for example, Japanese Patent Laid-open Publication No. 2005-142429).

Due to this light-receiving characteristic, the amount of light received on each photodiode is not increased in the conventional digital cameras as much as expected from a photographic film in a film camera, even if the aperture stop is opened to increase the amount of incident light. This is because of the fact that what is increased by opening the aperture stop is oblique light which has little impact on light-receiving efficiency. As a result, an opening/closing effect of the aperture stop (variability in the amount of light received by opening and closing the aperture stop) is not enhanced, and aperture stop value change is not effectively reflected in a captured image.

SUMMARY OF THE INVENTION

In view of the foregoing, an object of the present invention is to provide an imaging apparatus capable of enhancing an opening/closing effect of an aperture stop, and effectively reflecting aperture stop value change in a captured image.

In order to achieve the above and other objects, the imaging apparatus according to the present invention includes a solid state imaging device having a plurality of photodiodes, and this solid state imaging device has a light receiving characteristic in which an amount of light received reaches a maximum when an angle of incidence of parallel light is oblique to a light receiving surface of the photodiode.

It is preferred to provide the imaging apparatus with an aperture stop to limit incident light on the solid state imaging device.

The angle of incident light at which the amount of light received reaches the maximum is preferably in the range of 3° to 15° to a vertical line of the light receiving surface.

More preferably, the solid state imaging device has, on each photodiode, a core/clad light guide path structure whose core serves as a light guide path.

This light guide path includes a columnar portion standing upright on the light receiving surface, and a lens portion formed at an upper end of the columnar portion and collecting light into the columnar portion. The optical axis of this lens portion substantially coincides with a central axis of the columnar portion.

Further, the light guide path is preferably made of silicone nitride, and a clad surrounding the light guide path is preferably made of silicone dioxide.

The lens portion is preferably composed of a lower convex portion formed at the upper end of the columnar portion, and an upper convex portion formed on an upper surface of the lower convex portion. Alternatively, the lens portion may be composed of a planar portion formed at the upper end of the columnar portion, and an upper convex portion formed on an upper surface of the planar portion.

It is preferred that the columnar portion has a radius of greater than or equal to 0.27 μm.

It is also preferred to provide on each photodiode with a micro-lens and a color filter that transmits light in a specific wavelength range.

Further, the amount of light received by the solid state imaging device shows wavelength dependence, and the light receiving characteristic becomes apparent to light in a specific wavelength range.

This specific wavelength range is preferably a short wavelength range that includes blue and green light spectra.

According to the present invention, the solid state imaging device has the light receiving characteristic in which the amount of light received reaches a maximum when an angle of incidence of the parallel light is oblique to the light receiving surface. This increases the variability in the amount of light received by opening and closing the aperture stop, and the opening/closing effect of the aperture stop is enhanced. It is therefore possible to reflect the aperture stop value change in a captured image effectively.

BRIEF DESCRIPTION OF THE DRAWINGS

The above objects and advantages of the present invention will become more apparent from the following detailed description when read in connection with the accompanying drawings, in which:

FIG. 8 is a cross section view of a CCD image sensor according to a second embodiment of the present invention;

DETAILED DESCRIPTION OF THE PREFERRED EMBODIMENTS

Figure 1:
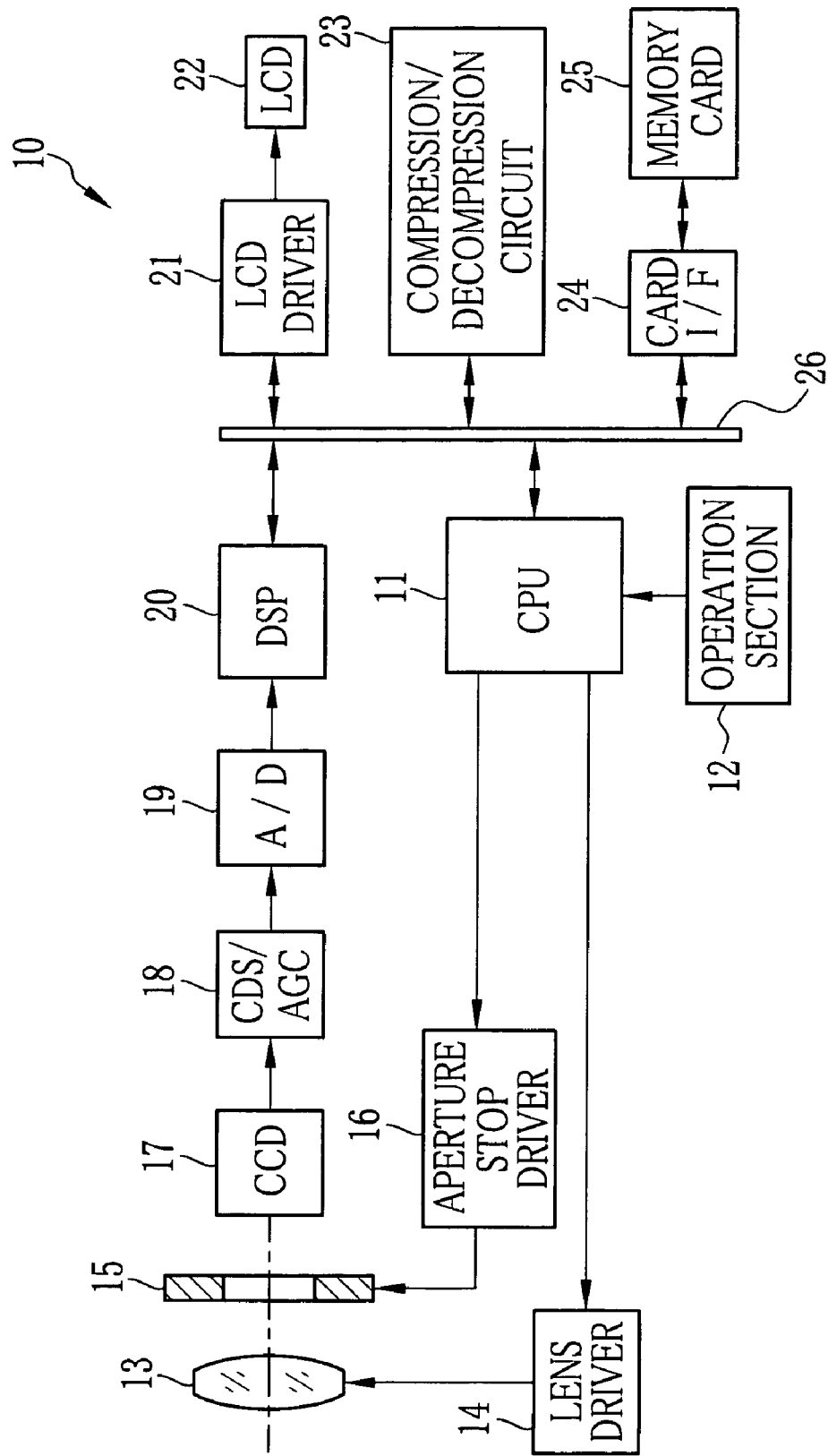
FIG. 1 is a block diagram of a digital camera according to the present invention.

Referring to FIG. 1, a digital camera 10 is entirely controlled by a CPU (main control circuit) 11. The CPU 11 controls the operation of each component, based on operation signals coming from an operation section 12 that includes a shutter release button, a menu button, and a selector key.

A taking lens 13 has a single or plural lenses, and a focus lens and the other components thereof are moved by a lens driver 14. The lens driver 14 is composed of a motor and a motor driver, and controlled by the CPU 11.

An aperture stop 15 is configured to change an aperture stop value continuously, and an aperture stop driver 16 drives the aperture stop 15 to change the aperture stop value. The aperture stop driver 16 is composed of a motor and a motor driver, and controlled by the CPU 11. The light having passed through the taking lens 13 is limited by the aperture stop 15, and then enters a CCD image sensor 17. Note that the aperture stop 15 does not necessarily take the above configuration, but may have a single plate with different size apertures and switch to one of these apertures.

The CCD image sensor 17 is an interline transfer CCD, which has a two dimensional array of photodiodes to photo-electrically convert incident light. This type of image sensor stores the signal charges generated by the photo-electric conversion, and transfers these signal charges to an output amplifier through vertical CCD registers and a horizontal CCD register. The configuration of the CCD image sensor 17 is described later in detail.

A CDS/AGC (correlation double sampling/auto-gain control) circuit 18 samples and holds an image signal coming from the CCD image sensor 17, and amplifies the signal to an appropriate level. An A/D converter 19 converts the image signal, coming from the CDS/AGC circuit 18, into digital image data and transfers this data to a DSP (digital signal processor) 20.

The DSP 20 applies image processing, such as color interpolation, YC conversion, gamma conversion, contour correction and white balance correction, to the image data. An LCD (liquid crystal display) driver 21 displays a through image of the processed image data on an LCD 22.

A compression/decompression circuit 23, activating when the shutter release button is operated, retrieves the image data from the DSP 20 and compresses the data using a predetermined format such as JPEG. A card I/F 24 writes this compressed image data to a detachable memory card 25.

In a reproduction mode, the card I/F 24 retrieves image data from the memory card 25. The retrieved image data is decompressed in the compression/decompression circuit 23, and displayed on the LCD 22 through the LCD driver 21. Note that a reference numeral 26 denotes a data bus connecting each component.

Figure 2:
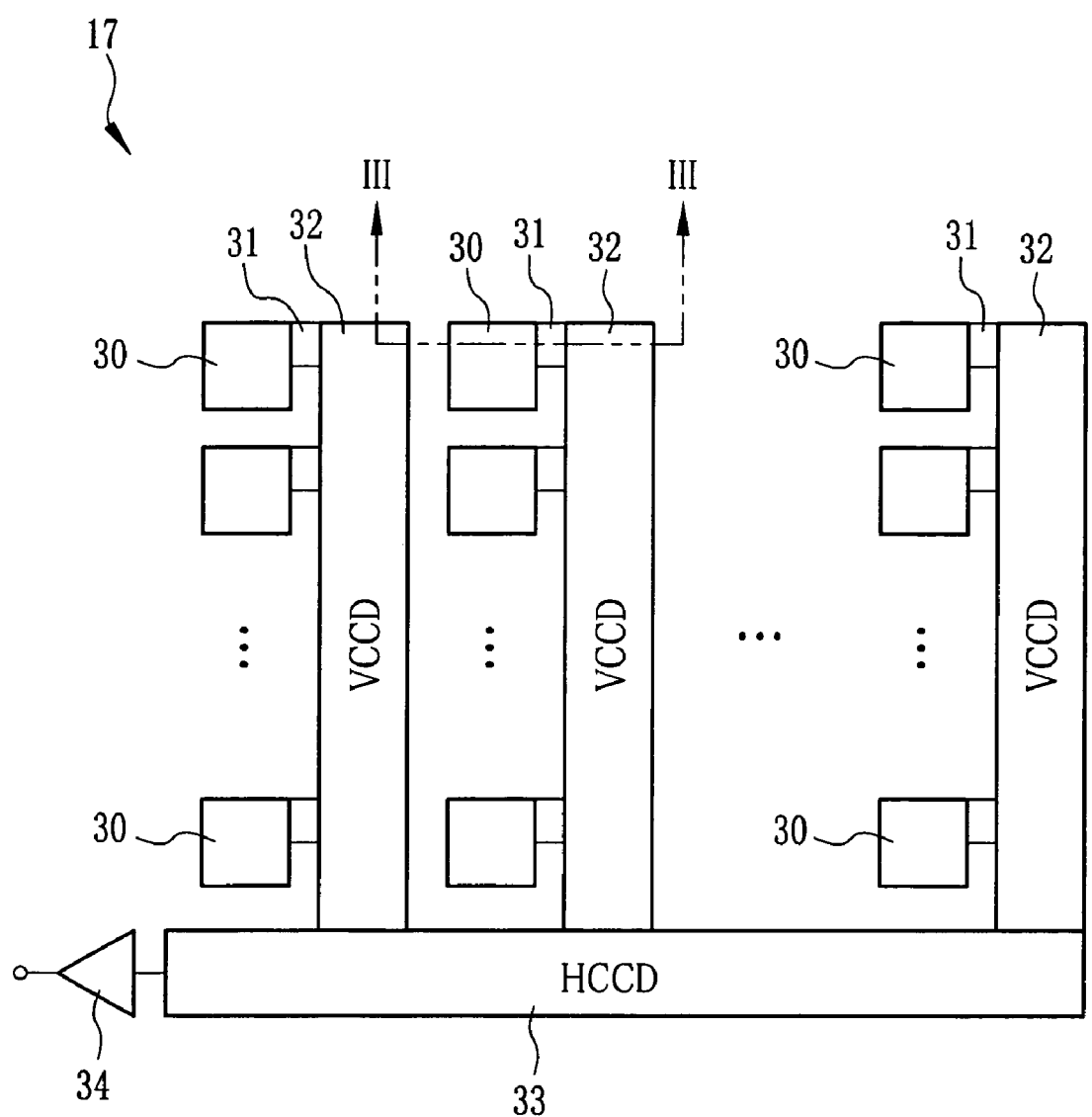
FIG. 2 is a plan view schematically illustrating a structure of a CCD image sensor according to the present invention.

Next, the configuration of the CCD image sensor 17 is described. In FIG. 2, the CCD image sensor 17 includes a two dimensional array of photodiodes (PD) 30, transfer gates (TG) 31 connected to respective PD 30, vertical CCD registers (VCCD) 32 alongside respective columns of the PD 30, a horizontal CCD register (HCCD) 33 connected to an output stage of each VCCD 32, and an output amplifier 34 connected to an output stage of the HCCD 33.

The PD 30 photo-electrically converts incident light and generates a signal charge, and stores it. At the end of an exposure period, all the TG 31 transmit the signal charge of the PD 30 to the VCCD 32 simultaneously. Each VCCD 32 shifts the signal charge in the vertical direction, one row at a time, toward the HCCD 33. The HCCD 33 receives the signal charge, one row at a time, from the output stages of the VCCD 32, and transfers the signal charges in the horizontal direction to the output amplifier 34. The output amplifier 34 detects the signal charge at the output stage of the HCCD 33, and outputs a voltage signal (image signal) corresponding to the amount of the signal charge.

Figure 3:
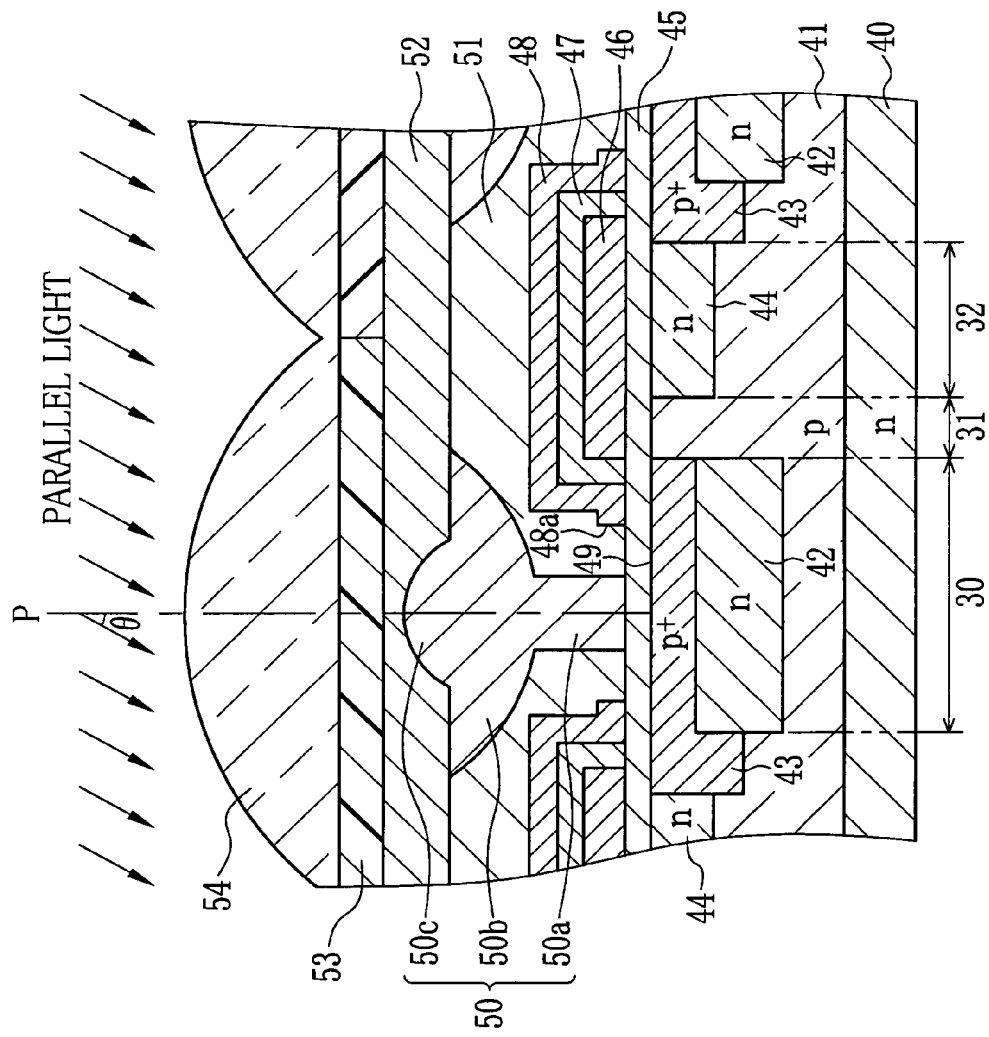
FIG. 3 is a cross section view along a III-III line in FIG. 2.

As shown in FIG. 3, a p-type well layer 41 is formed on an n-type silicon substrate 40. Provided in the p-type well layer 41 are n-type layers 42 to store the signal charge (electron) generated during the photo-electric conversion. On each n-type layer 42, a $p^+$-type layer 43 to store positively charged electron holes is formed. The PD 30 is so-called an embedded photodiode constituted of this pnpn structure.

On a top surface of the p-type well layer 41, the $p^+$-type layers 43 and n-type layers 44 are formed. The n-type layers 42, 44 are separated from each other by the p-type well layer 41 or the $p^+$-type layer 43. Additionally, transfer electrodes 46 are provided on each n-type layer 44 across a gate insulating film 45. Each of the aforesaid TG 31 is constituted of the p-type well layer 41 and the transfer electrode 46 between the n-type layers 42, 44, while each of the aforesaid VCCD 32 is constituted of the n-type layer 44 and the transfer electrode 46. According to the voltage applied thereto, the transfer electrode 46 controls the TG 31 and the VCCD 32 for the charge transfer operation. In this embodiment, the gate insulating film 45 is made of silicon oxide ($SiO_2$), and the transfer electrodes 46 are made of polysilicon (multicrystal Si).

A first interlayer insulating film 47 is formed to cover lateral and upper surfaces of each transfer electrode 46. Formed over the transfer electrode 46, across the first interlayer insulating film 47, is a light shielding film 48. While covering the transfer electrode 46 to protect from light, the light shielding film 48 has openings 48a above each PD 30. The first interlayer insulating films 47 are made of silicon oxide ($SiO_2$), and the light shielding film 48 is made of aluminum (Al).

A light guide path 50 is formed on a light receiving surface 49 of each PD 30 across the gate insulating film 45. The light guide path 50 includes a columnar portion 50a standing upright on the light receiving surface 49, a lower convex portion 50b formed integral with an upper end of the columnar portion 50a, and an upper convex portion 50c formed integral with a top surface of the lower convex portion 50b. The columnar portion 50a is substantially cylindrical. The lower convex portion 50b is spherical at the bottom and flat on the top. The upper convex portion 50c has a spherical top surface and projects from the flat top surface of the lower convex portion 50b. The lower and the upper convex portions 50b, 50c constitute an inner layer lens which guides light to the columnar portion 50a. An optical axis of this inner layer lens substantially coincides with a central axis of the columnar portion 50a, which is substantially perpendicular to the light receiving surface 49. Namely, the light guide path 50 is almost rotationally symmetric about a vertical line (line P in the drawing) of the light receiving surface 49.

The light guide path 50 is surrounded by a second interlayer insulating film 51. The second interlayer insulating film 51 covers lateral and top surfaces of the light shielding film 48, while its upper surface supports a planarizing layer 52 of BPSG (Boron-Doped Phosphorous Silicate Glass). Provided on the planarizing layer 52 is a color filter 53 which transmits light with specific wavelengths such as red, green and blue light. On top of the color filter 53, an array of convex micro-lenses 54 is provided to collect incident light.

The light guide path 50 effectively transmits the light, collected by the micro-lens 54 and selected by the color filter 53, to the PD 30. The light guide path 50 is made of, for example, silicon nitride (SiN) with refractive index of approximately 2.10, and serves as a core. The second interlayer insulating film 51 is made of, for example, silicon oxide ($SiO_2$) with refractive index of approximately 1.45, and serves as a clad. Namely, the light guide path 50 and the second interlayer insulating film 51 constitute a core/clad light guide path structure.

Figure 4:
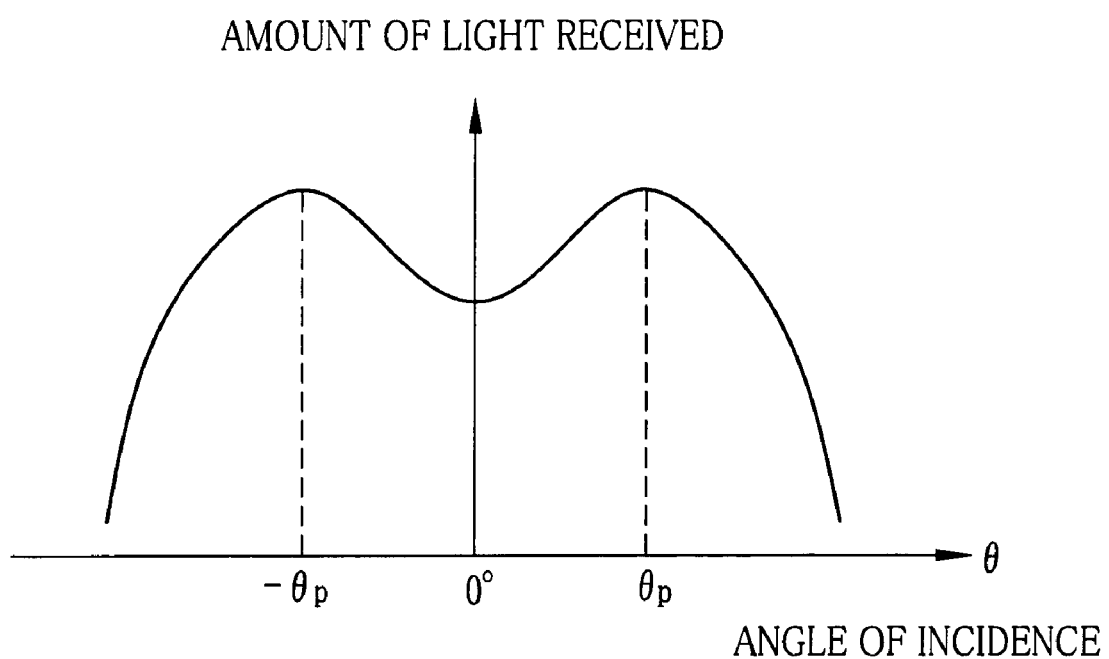
FIG. 4 is a graph of an amount of light received on the CCD image sensor versus an angle of incidence.

An exemplary light-receiving characteristic of the CCD image sensor 17 is shown in FIG. 4. In this graph, a horizontal axis represents an angle of incidence θ (see, FIG. 3) of radiation light (parallel light), while a vertical axis represents an amount of light received (amount of light to be photo-electrically converted) on the PD 30. The amount of light received on the PD 30 becomes the maximum at the angle of incidence of θp and −θp (θ≠0). In other words, when the angle of incidence θ is changed between −90° and 90°, the light-receiving characteristic shows two peak points (hereinafter, referred to as double top characteristic). This double top characteristic is attributed to a combinational structure of the columnar portion 50a and the lower convex portion 50b in the light guide path 50. The CCD image sensor 17 shows the double top characteristic against the light of at least one of the B, G and R light spectra.

Figure 5A:
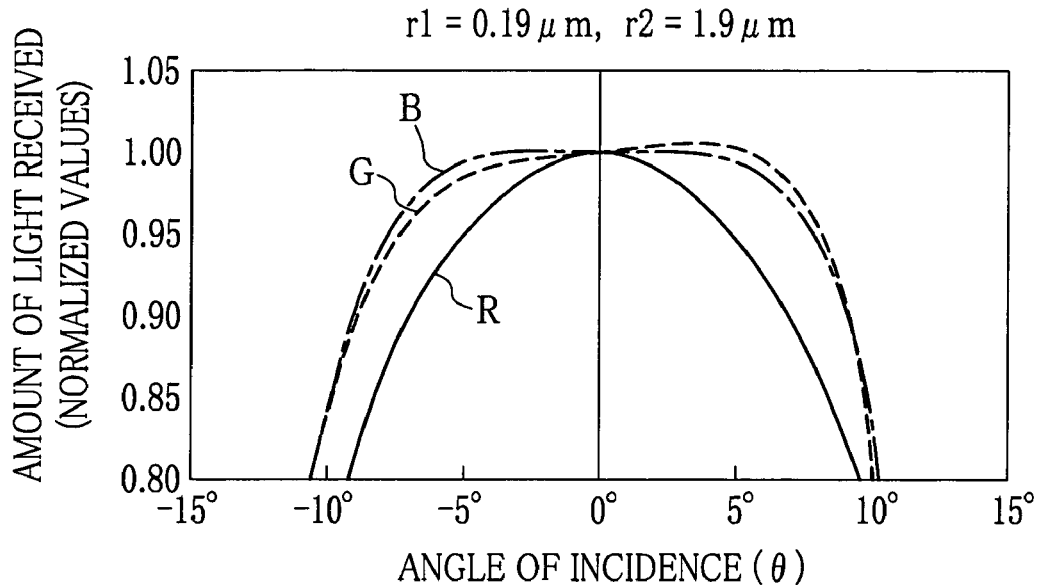
FIG. 5A and FIG. 5B are graphs of model calculation for the amount of light received on the CCD image sensor versus the angle of incidence, calculated by a FDTD method.
Figure 5B:
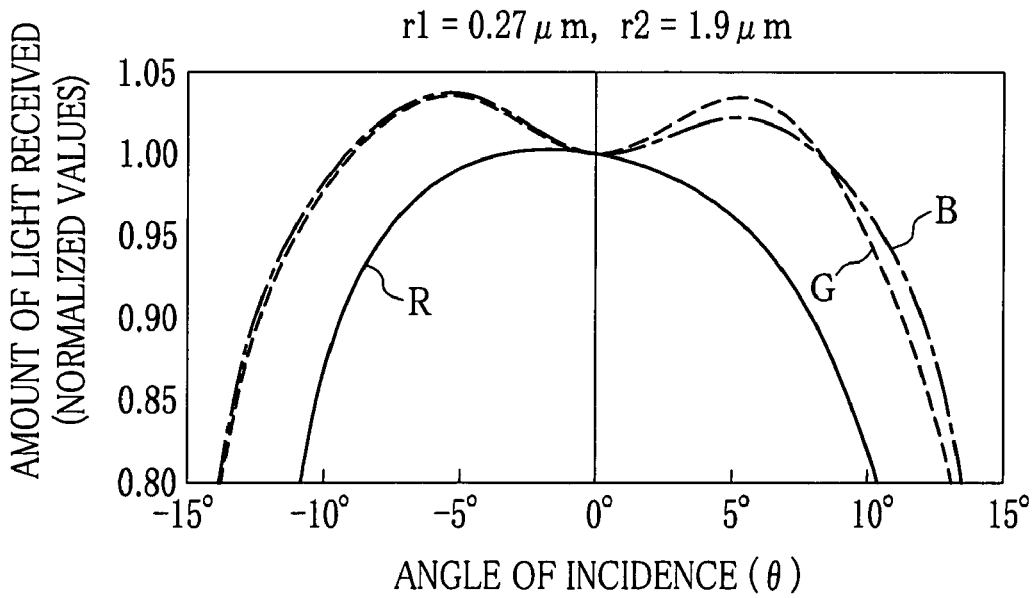
Figure 6:
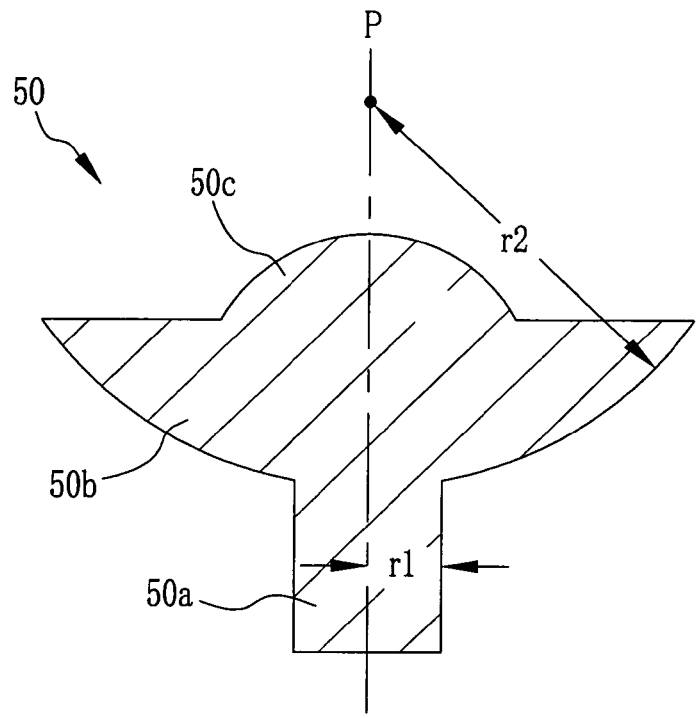
FIG. 6 is a cross section view illustrating a radius of a columnar portion and a curvature radius of a lower convex portion composing a light guide path.

To verify the light receiving characteristic, model calculation was performed using the FDTD (Finite Difference Time Domain) method. The results are shown in the graphs of FIG. 5A and FIG. 5B. In FIG. 5A, a radius r1 (see FIG. 6) of the columnar portion 50a was set to 0.19 μm, while in FIG. 5B the radius r1 was 0.27 m. A curvature radius r2 (see FIG. 6) of the lower convex portion 50b was set to 1.9 μm in both FIG. 5A and FIG. 5B. Additionally, both graphs show the characteristics in three different conditions, one that the color filter 53 transmits the red light (R) with 630 nm wavelength, another one that the color filter 53 transmits the green light (G) with 540 nm wavelength, and the other one that the color filter 53 transmits the blue light (B) with 480 nm wavelength.

According to FIG. 5A and FIG. 5B, the amount of light received depends on the radius r1 of the columnar portion 50a, and the double top characteristic is more apparent as the radius r1 increases. In addition, the amount of light received shows wavelength dependence, and the double top characteristic is more apparent in a short wavelength range that includes the green and blue light spectra.

Figure 7:
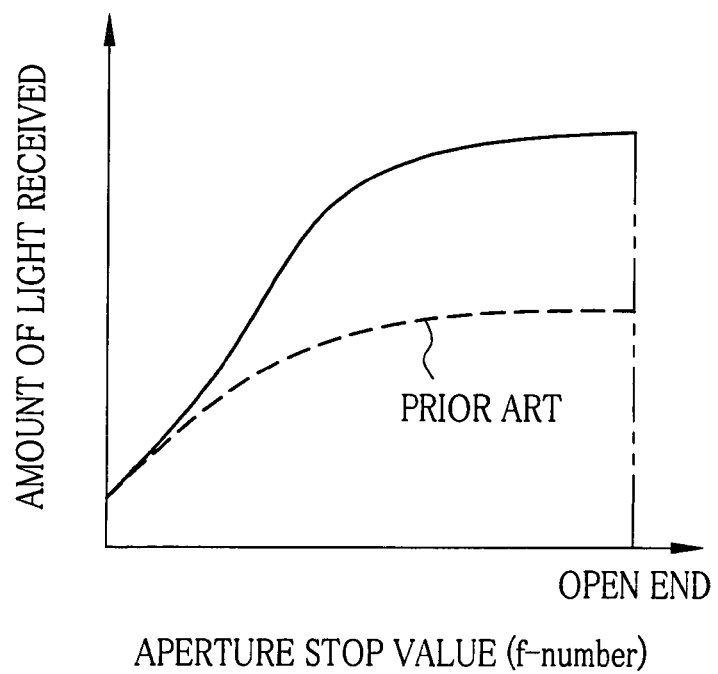
FIG. 7 is a graph of the amount of light received on the CCD image sensor versus an aperture stop value.

Next, in FIG. 7, a relationship of the light receiving characteristic of the CCD image sensor 17 versus aperture stop values (f-numbers) of the aperture stop 15 under constant luminance is shown. Since the CCD image sensor 17 shows the double top characteristic to the light with at least one wavelength selected by the color filter 53, the amount of light received changes more greatly than the prior art CCD image sensors (not showing the double top characteristic) when the aperture stop 15 is opened (the f-number is decreased). The angle of incidence $θ_p$ is preferably in the range of 3° to 15°, and the amount of light received changes most greatly when the incident light at the angles $θ_p$, $−θ_p$ is increased by the change of the aperture stop value. Accordingly, the digital camera 10 can provide the superior opening/closing effect of the aperture stop 15, and effectively reflect the change of the aperture stop value made by the user in a captured image.

Next, a second embodiment of the present invention is described with reference to FIG. 8. This embodiment corresponds to the situation where the curvature radius r2 of the lower convex portion 50b is set to an infinite value under the first embodiment condition. A light guide path 60 includes a columnar portion 60a standing upright on the light receiving surface 49, a planar portion 60b formed integral with an upper end of the columnar portion 60a, and an upper convex portion 60c formed integral with a top surface of the planar portion 60b. The columnar portion 60a is substantially cylindrical. The planar portion 60b is substantially discoidal. The upper convex portion 60c has a spherical top surface and projects from the flat top surface of the planar portion 60b. The planar portion 60b and the upper convex portion 60c constitute an inner layer lens which guides light to the columnar portion 60a. In this embodiment, the same components as the first embodiment are labeled with the same numerals, and a detailed explanation thereof is omitted.

Figure 9A:
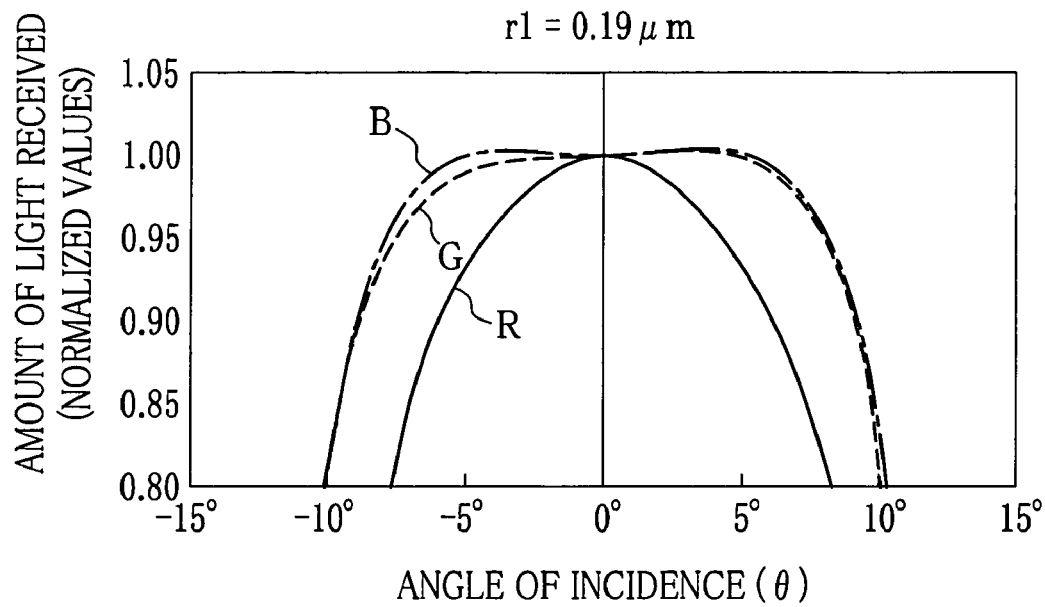
FIG. 9A and FIG. 9B are graphs of model calculation for the amount of light received on the second embodiment CCD image sensor versus the angle of incidence, calculated by the FDTD method.
Figure 9B:
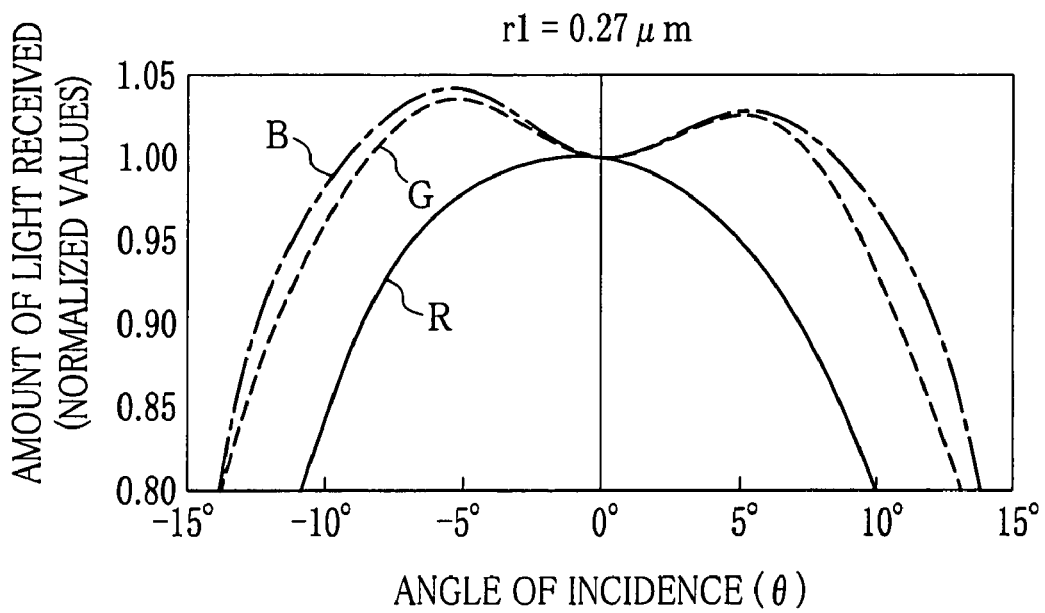
Figure 10:
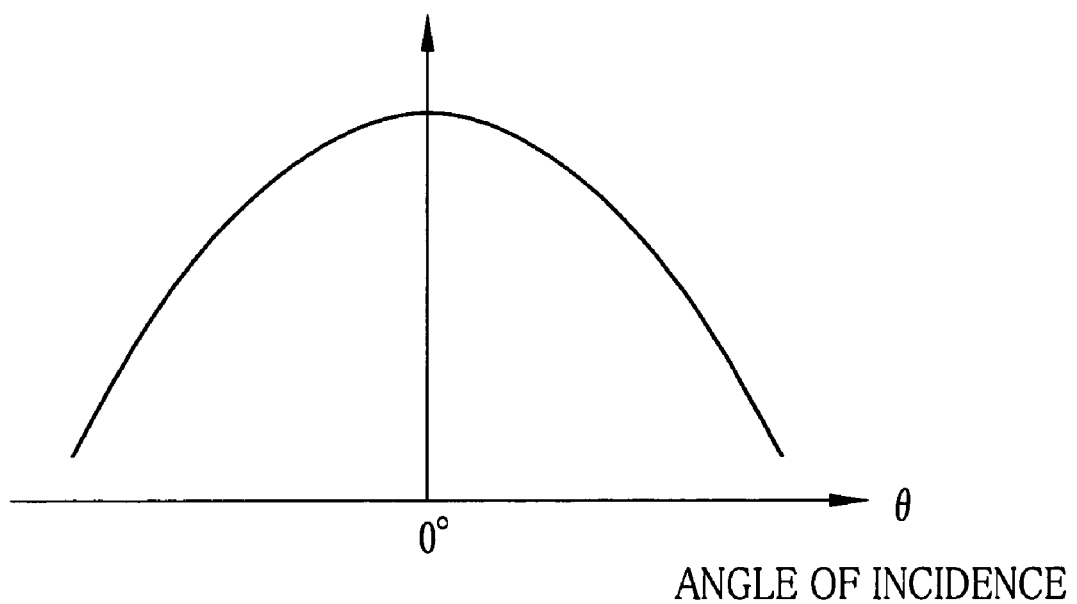
FIG. 10 is a graph of the amount of light received on a conventional CCD image sensor versus the angle of incidence.

FIG. 9A and FIG. 9B show the graphs of model calculation, by the FDTD method, of the light receiving characteristic in the second embodiment. In FIG. 9A, the radius r1 of the columnar portion was 0.19 μm, while in FIG. 9B the radius r1 was 0.27 μm. Additionally, both graphs show the characteristics in three different conditions, one that the color filter 53 transmits the red light (R) with 630 nm wavelength, another one that the color filter 53 transmits the green light (G) with 540 nm wavelength, and the other one that the color filter 53 transmits the blue light (B) with 480 nm wavelength.

The results of the second embodiment are almost the same as the first embodiment (see FIG. 5). Namely, similar to the first embodiment, the amount of light received depends on the radius r1 of the columnar portion 60a, and the double top characteristic is more apparent as the radius r1 increases. Additionally, the amount of light received shows wavelength dependence, and the double top characteristic is more apparent in a short wavelength range that includes the green and the blue light spectra. Also in the second embodiment, the digital camera 10 can provide the same opening/closing effect of the aperture stop as in FIG. 7, and effectively reflect the change of the aperture stop value made by the user in a captured image.

While the above embodiments illustrate two types of light guide path structures that show the double top characteristic on the relationship between the amount of light received and the angle of incidence, any type of light guide path structure may be incorporated as long as it produces the double top characteristic. The double top characteristic can be confirmed by radiating parallel light with constant luminance to the CCD image sensor and, while changing the angle of incidence θ of the parallel light, detecting the maximum value (maximum amount of light received) of an image signal for each color which the CCD image sensor outputs.

The above preferred embodiments are explained using the CCD image sensor, but the present invention may also be applicable to a CMOS image sensor and other types of solid state imaging devices.

Although the present invention has been fully described by the way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. An imaging apparatus comprising:
    a solid state imaging device having a plurality of photodiodes, said solid state imaging device having a light receiving characteristic in which two peak points exist in an amount of light received when an angle of incidence of parallel light is changed between −90° and 90°, and the amount of light received reaches a maximum on at least one of the two peak points.

2. The imaging apparatus of claim 1, further comprising: an aperture stop for limiting an incident light on said solid state imaging device.

3. The imaging apparatus of claim 1, wherein said angle of incidence of parallel light at which said amount of light received reaches a maximum is in a range of 3° to 15° to an axis perpendicular to a light receiving surface of a photodiode of the plurality of photodiodes.

4. The imaging apparatus of claim 1, wherein said solid state imaging device provide each of said plurality of photodiodes with a core/clad light guide path structure whose core serves as a light guide path.

5. The imaging apparatus of claim 4, wherein said light guide path includes a columnar portion standing upright on said a light receiving surface of a photodiode of the plurality of photodiodes, and a lens portion, formed at an upper end of said columnar portion, collects light into said columnar portion.

6. The imaging apparatus of claim 5, wherein an optical axis of said lens portion substantially coincides with a central axis of said columnar portion.

7. The imaging apparatus of claim 6, wherein said light guide path comprises silicon nitride and a clad surrounding said light guide path comprises silicone dioxide.

8. The imaging apparatus of claim 5, wherein said lens portion comprises a lower convex portion formed at said upper end of said columnar portion, and an upper convex portion formed on an upper surface of said lower convex portion.

9. The imaging apparatus of claim 5, wherein said lens portion comprises a planar portion formed at said upper end of said columnar portion, and an upper convex portion formed on an upper surface of said planar portion.

10. The imaging apparatus of claim 5, wherein said columnar portion comprises a radius greater than or equal to 0.27 µm.

11. The imaging apparatus of claim 1, wherein said solid state imaging device provides each of said plurality of photodiodes with a micro-lens and a color filter for transmitting light in a specific wavelength range.

12. The imaging apparatus of claim 1, wherein said amount of light received by said solid state imaging device shows a wavelength dependence, and a light receiving characteristic becomes apparent to light in a specific wavelength range.

13. The imaging apparatus of claim 12, wherein said specific wavelength range is a short wavelength range including blue light spectra and green light spectra.

14. The imaging apparatus of claim 1, further comprising: a light guide path comprising a columnar portion standing upright on a light receiving surface of a photodiode of said plurality of photodiodes and a lens portion disposed over the columnar portion, the lens portion including an upper convex portion and comprising a material which is the same as a material of the columnar portion.

15. The imaging apparatus of claim 14, wherein the lens portion further comprises:
a lower lens portion, disposed above the columnar portion and below the upper convex portion, the lower lens portion comprising a maximum width, in a direction perpendicular to an axis of the columnar portion, greater than a maximum width, in a direction perpendicular to an axis of the columnar portion, of the upper convex portion.

16. The imaging apparatus of claim 15, wherein the upper convex portion comprises a spherical top surface and extends away from a flat top surface of the lower lens portion.

17. The imaging apparatus of claim 16, wherein a bottom of the lower lens portion comprises a spherical-shape and a top portion of the lower lens portion comprises a flat surface.

18. The imaging apparatus of claim 16, wherein the lower lens portion comprises a substantially discoidal-shape.

19. An imaging apparatus comprising:
a solid state imaging device comprising a plurality of photodiodes, said solid state imaging device comprising a light receiving characteristic in which an amount of light received reaches a maximum when an angle of incidence of parallel light is oblique to a light receiving surface of a photodiode of said plurality of photodiodes; and
a light guide path comprising a columnar portion standing upright on said light receiving surface, and a lens portion disposed over the columnar portion, the lens portion further comprising:
an upper convex portion; and
a lower lens portion, disposed above the columnar portion and below the upper convex portion, the lower lens portion comprising a maximum width, in a direction perpendicular to an axis of the columnar portion, greater than a maximum width, in a direction perpendicular to an axis of the columnar portion, of the upper convex portion.

20. The imaging apparatus of claim 19, wherein the lens portion comprises a material which is the same as a material of the columnar portion.

* * * * *